(12) United States Patent
Chen

(10) Patent No.: US 7,652,893 B2
(45) Date of Patent: Jan. 26, 2010

(54) SINGLE OR DUAL ELECTRONIC PACKAGE WITH FOOTPRINT AND PIN SHARING

(75) Inventor: Yen-Ming Chen, Richmond Hill (CA)

(73) Assignee: ATI Technologies ULC, Markham, Ontario (CA)

(*) Notice: Subject to any disclaimer, the term of this patent is extended or adjusted under 35 U.S.C. 154(b) by 85 days.

(21) Appl. No.: 10/908,122

(22) Filed: Apr. 28, 2005

(65) Prior Publication Data
US 2006/0245164 A1  Nov. 2, 2006

(51) Int. Cl.
H05K 1/18 (2006.01)

(52) U.S. Cl. .................................................... 361/764
(58) Field of Classification Search ............... 257/786, 257/692, 778, 776, 697, 734, 693, 695; 361/764
See application file for complete search history.

(56) References Cited

U.S. PATENT DOCUMENTS

| | | | |
|---|---|---|---|
| 5,061,825 A | 10/1991 | Catlin | |
| 5,266,747 A | 11/1993 | Gheorghiu | |
| 5,585,676 A * | 12/1996 | Uda et al. | 257/786 |
| 6,274,824 B1 | 8/2001 | Rueda-Aguilocho et al. | |
| 6,737,581 B2 | 5/2004 | Hogerl | |
| 7,091,740 B2 * | 8/2006 | Simons | 326/8 |

OTHER PUBLICATIONS

General Purpose Transistor, NPN Silicon, Nov. 2001, 8 pgs., Rev. 3. Literature Distribution Center for ON Semiconductor, US.
Ultra 1.24V Prevision Adjustable Shunt Regulator, Alpha Semiconductor, Aug. 23, 1999, 9 pgs.. Alpha Semiconductor, Inc., US.
TinyLogic UHS 2-Input and Gate, Oct. 1996, Rev. Sep. 2001. 9 pgs., Fairchild Semiconductor Corporation.

(Continued)

Primary Examiner—Javaid Nasri
(74) Attorney, Agent, or Firm—Vedder Price P.C.

(57) ABSTRACT

A 6-pin electronic package includes a first side including a pair of first outer pins and a first middle pin, and a second side including a pair of second outer pins and a second middle pin. The first outer pins and the second middle pin are operatively coupled to a first circuit to provide a first function. The second outer pins and the first middle pin are operatively coupled to a second circuit to provide a second function. The 6-pin electronic package can be replaced on a circuit substrate with a first electronic package and a second electronic package that collectively include at least six pins. The 6-pin electronic package and the first and second electronic packages can be interchangeably used on a circuit substrate of an electronic device. The circuit substrate may include any one of the 6-pin electronic package mountable to the circuit substrate, and the first and second electronic packages. The first electronic package is mountable on the circuit substrate on a same footprint as the 6-pin electronic package. The second electronic package is mountable on the circuit substrate adjacent the first electronic package such that six pins of the first and second electronic packages share the same footprint as the pins of the 6-pin electronic package.

14 Claims, 9 Drawing Sheets

OTHER PUBLICATIONS

Dual Adjustable Prevision Shunt Regulator, Aug. 14, 2004, Rev.2.02, 6 pgs., Silicon Standard Corp.

Adjustable Precision Shunt Regulators, Jul. 1978, Rev. Dec. 2003, 32 pgs., Texas Instruments, US.

Dual Low-Voltage Shunt Regulator, May 25, 2004, Rev. 1.01, 5 pgs., Silicon Standard Corporation.

Adjustable Low Voltage Shunt Regulator, 2004, 10 pgs., Advanced Analogic Technologies, US.

* cited by examiner

SINGLE OR DUAL ELECTRONIC PACKAGE WITH FOOTPRINT AND PIN SHARING

FIELD OF THE INVENTION

The present invention generally relates to electronic packages, and more particularly, to a single or dual electronic package with footprint and pin sharing.

BACKGROUND OF THE INVENTION

Electronic devices typically include a circuit substrate, such as a printed circuit board on which a number of electronic and/or optical components may be mounted. Each electronic and optical component may include one or more circuits that provide one or more functions for the electronic component. For example, an electronic component may include a single component circuit such as a transistor, or a multi-component circuit, such as a voltage regulator. Each component may include a number of inputs that provide data or signals to the component and a number of outputs that provide data or signals that may be generated in accordance with the function performed by the component.

Certain electronic components are commonly used in a variety of electronic devices. For example, almost every electronic device includes one or more transistors. Accordingly, standard electronic package configurations have been established by various industries in an attempt to standardize the size, shape, input and output pin arrangements, and various other characteristics of common electronic components.

A type of standardized electronic package is the SOT-23-6 (Small-Outline Transistor) package, which includes a rectangular enclosure that houses one or more single or multicomponent circuit(s) and includes six input/output pins. Three pins are arranged at equal distances on one side of the enclosure, while the remaining three pins are arranged in the same fashion on an opposite side of the enclosure. The pins are connected to the circuit(s) housed in the enclosure to provide input to and output from the circuit(s).

Another standardized electronic package is the SOT-23-3 package, which includes a rectangular enclosure that houses one or more single or multicomponent circuit(s) and includes three input/output pins. Two pins are arranged at equal distances on one side of the enclosure, while the remaining pin is arranged at the center of an opposite side of the enclosure. The pins are connected to the circuit(s) housed in the enclosure to provide input to and output from the circuit(s). The enclosure of the SOT-23-3 package is identical in size to the enclosure of the SOT-23-6 package. Additionally, the three pins of the SOT-23-3 package are arranged on the enclosure at the same locations as three corresponding pins of the SOT-23-6 package.

Yet another standardized electronic package is the SOT-23-5 package, which includes a rectangular enclosure that houses one or more single or multicomponent circuit(s) and includes five input/output pins. Two pins are arranged at equal distances on one side of the enclosure, while three pins are arranged equal distances on an opposite side of the enclosure. The pins are connected to the circuit(s) housed in the enclosure to provide input to and output from the circuit(s). The enclosure of the SOT-23-5 package is identical in size to the enclosure of the SOT-23-6 package. Additionally, the five pins of the SOT-23-5 package are arranged on the enclosure at the same locations as five corresponding pins of the SOT-23-6 package.

Because a pair of SOT-23-3 packages collectively have six pins, a pair of SOT-23-3 packages, with each performing a single function, may be substituted on a circuit substrate for a single SOT-23-6 package that performs both functions. Additionally, because a SOT-23-3 package and a SOT-23-5 package collectively have at least six pins, with each performing a single function, they may be substituted on a circuit substrate for a single SOT-23-6 package that performs both functions. However, the space used by the pair of SOT-23-3 packages or a SOT-23-3 package and a SOT-23-5 package may exceed the available space on the substrate where the SOT-23-6 package was mounted due to the pin arrangements of the SOT-23-6 package, any one of the SOT-23-3 packages, and the SOT-23-5 package. The space on the circuit substrate where the SOT-23-6 package was mounted may not be usable by any of the SOT-23-3 packages and/or the SOT-23-5 package.

Therefore, there is a need for a single 6-pin electronic package that can be replaced with a pair of similarly sized and arranged electronic packages that collectively include at least six pins on circuit substrates where space is limited.

BRIEF DESCRIPTION OF THE DRAWINGS

The features of the present invention that are believed to be novel are set forth with particularity in the appended claims. The invention may best be understood by reference to the following description taken in conjunction with the accompanying drawings and the several figures of which like reference numerals identify like elements.

DETAILED DESCRIPTION OF THE INVENTION

The present disclosure relates to a 6-pin electronic package that can be replaced on a circuit substrate with a first electronic package and a second electronic package that collectively include at least six pins. The 6-pin electronic package includes a first side including a pair of first outer pins and a first middle pin, and a second side including a pair of second outer pins and a second middle pin. The first outer pins and the second middle pin are operatively coupled to a first circuit to provide a first function. The second outer pins and the first middle pin are operatively coupled to a second circuit to provide a second function.

The 6-pin electronic package and the first and second electronic packages can be interchangeably used on a circuit substrate of an electronic device. The circuit substrate may include any one of the 6-pin electronic package mountable to the circuit substrate, and the first and second electronic packages. The first electronic package is mountable on the circuit substrate on the same footprint as the 6-pin electronic package. The second electronic package is mountable on the circuit substrate adjacent the first electronic package such that six pins of the first and second electronic packages share the same footprint as the pins of the 6-pin electronic package.

Figure 1:
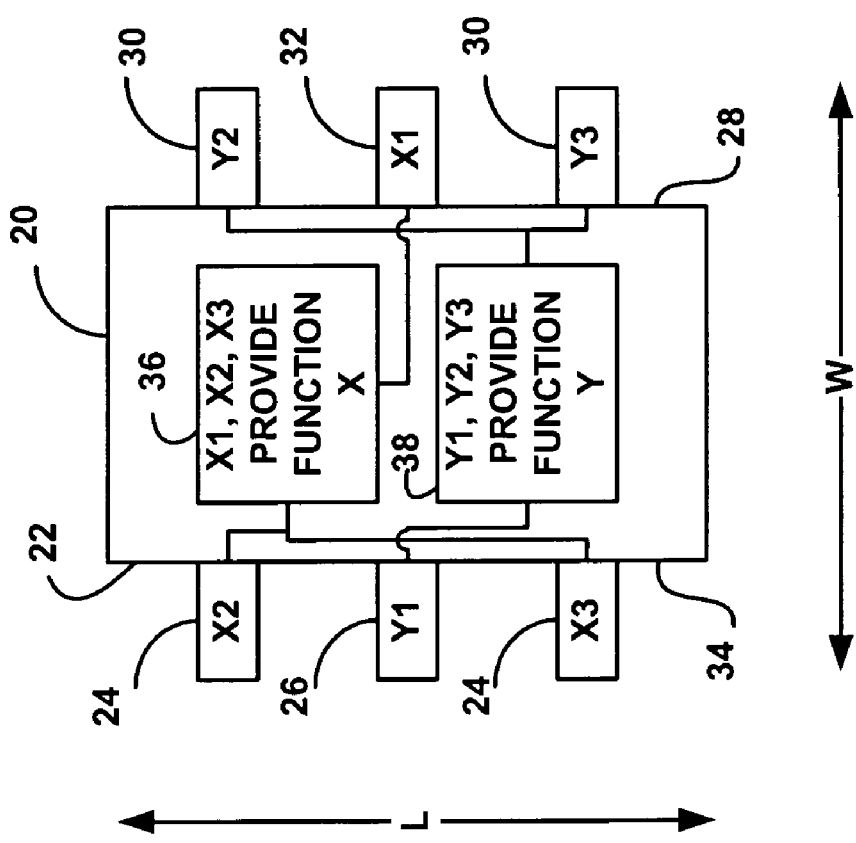
FIG. 1 is a diagram of a 6-pin electronic package constructed in accordance with the teachings of the present disclosure.

Referring to FIG. 1, a diagram of a 6-pin electronic package 20 constructed in accordance with the teachings of the present disclosure is shown. The 6-pin electronic package 20 includes a first side 22 having a pair of first outer pins 24 and a first middle pin 26. The 6-pin electronic package 20 also includes a second side 28 having a pair of second outer pins 30 and a second middle pin 32. The 6-pin electronic package 20 includes an enclosure 34 that houses a first circuit 36 and a second circuit 38. The first circuit 38 provides a first function and is operatively coupled to the first outer pins 24 and the second middle pin 32. The second circuit 38 provides a second function and is operatively coupled to the second outer pins 30 and the first middle pin 26.

The first circuit 36 may be any type of suitable circuit, such as an analog, a digital, and/or an optical circuit that provides the first function. The first circuit 36 may be a multicomponent circuit. An example of such a circuit may be a voltage regulator circuit that provides a voltage regulator function. The first circuit 36 may also be a single component circuit. An example of such a circuit may be a transistor. Similarly, the second circuit 38 may be any type of suitable circuit, such as an analog, a digital, and/or an optical circuit that provides the second function. The second circuit 38 may be a multicomponent circuit. An example of such a circuit may be a voltage regulator circuit that provides a voltage regulator function. The second circuit 38 may also be a single component circuit. An example of such a circuit may be a transistor.

In the following, the first function provided by the first circuit 36 will be referred to as function X and the second function provided by the second circuit 38 will be referred to as function Y. Accordingly, the second middle pin 32 and the first outer pins 24, which are operatively coupled to the first circuit 36, are labeled X1, X2, and X3, respectively. Similarly, the first middle pin 26 and the second outer pins 30, which are operatively coupled to the second circuit 38, are labeled Y1, Y2, and Y3, respectively.

The function X and the function Y may be independent from each other or related in such a way so that one function is extractable from another. For example, to illustrate functions X and Y as being independent functions, the function X may provide the function of adding X1 and X2 to result in X3, or X1+X2=X3; and the function Y may provide the function of adding Y1 to Y2 to result in Y3, or Y1+Y2=Y3. Alternatively, the functions X and Y may be dependent functions such that one of the functions is extractable from the other or one of the functions is a subset of the other function. For example, the 6-pin electronic package 20 can utilize the pins 24, 26, 30 and 32 to provide the function X1+X2+Y1+Y2=X3+Y3. By shutting off the second outer pins 30 and the first middle pin 26, which correspond to the pins Y1, Y2 and Y3, the function X, or X1+X2=X3 can be extracted from the above X and Y function of the 6-pin electronic package 20. Similarly, by shutting off the first outer pins 24 and the second middle pin 32, which correspond to the pins X1, X2 and X3, the function Y, or Y1+Y2=Y3 can be extracted from the above X and Y function of the 6-pin package 20.

Figure 2:
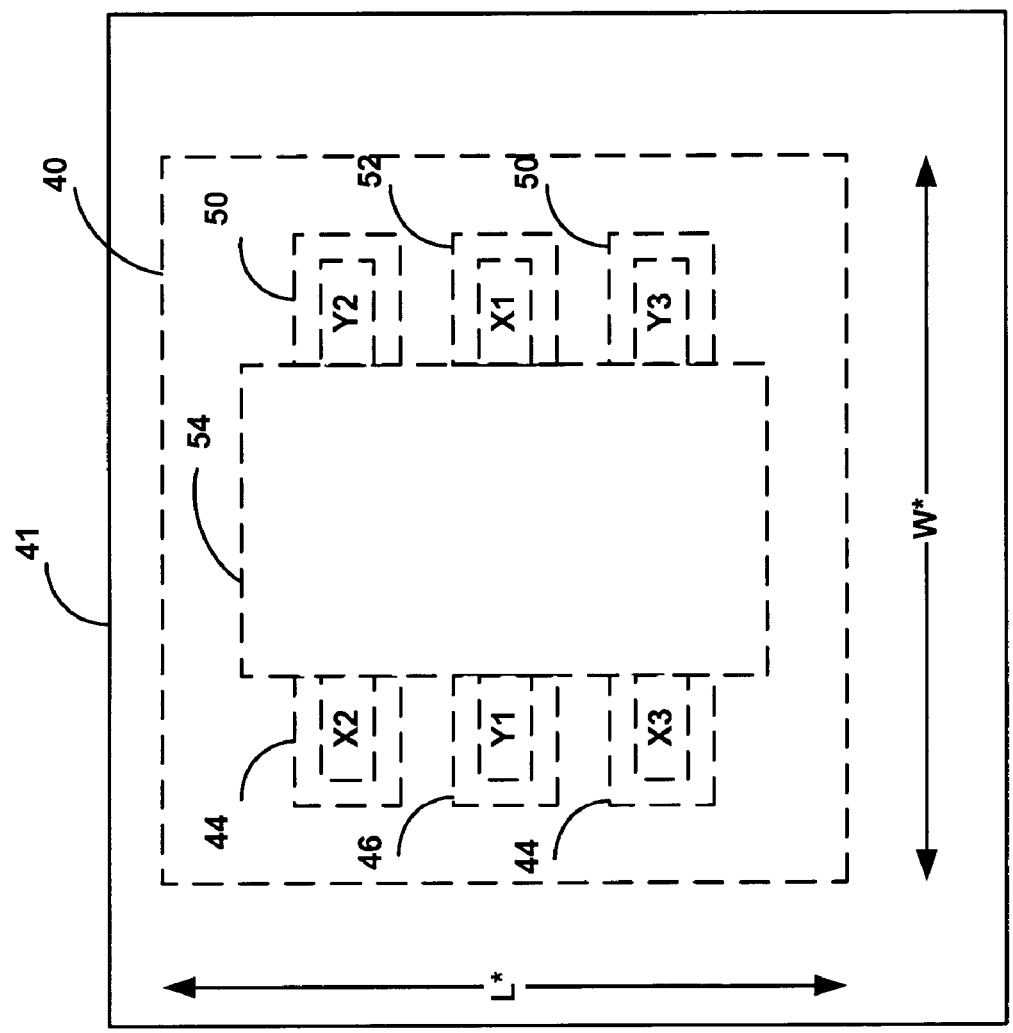
FIG. 2 is a diagram of a footprint on a circuit substrate of the 6-pin electronic package of FIG. 1.

Referring to FIG. 2, a footprint 40 of the 6-pin electronic package 20 when mounted on a circuit substrate 41 is shown. The first outer pins 24 and the first middle pin 26 have footprints 44 and 46, respectively. Similarly, the second outer pins 30 and the second middle pin 32 have the footprints 50 and 52, respectively. The footprints 44, 46, 50 and 52 may be larger than the size of the pins to which they correspond, because when the 6-pin electronic package 20 is mounted on the circuit substrate 41, the pins are connected to the circuit substrate 41 by methods that may create a footprint that is larger than the pin itself. For example the 6-pin electronic package 20 may be soldered to the circuit substrate 41. Accordingly, once mounted on the circuit substrate 41, the footprint of the 6-pin electronic package 20 may be larger than the size of the 6-pin electronic package itself. As shown in FIG. 2, the width of the footprint of the 6-pin electronic package 20 and the length thereof are labeled W* and L*, respectively. The enclosure 34 has a footprint 54, which may be similar in size to the actual size of the enclosure 34.

A first electronic package and a second electronic package can be substituted on the circuit substrate 41 for the 6-pin electronic package to share the footprint of the 6-pin electronic package and perform the functions X and Y. Each electronic package is similarly sized and pin configured as the 6-pin electronic package. Additionally, the first electronic package and the second electronic package collectively include at least six pins. In the following, the first electronic package and the second electronic package are described in detail as a pair of 3-pin electronic packages. Additionally, another example of the first and second electronic packages is provided as a combination of a 3-pin electronic package and a 5-pin electronic package. However, one of ordinary skill in the art will readily appreciate that any types of first electronic and second electronic packages that are similarly sized as the above-described 6-pin electronic package, collectively include at least six pins, and include the herein disclosed functional pin configurations so as to share the footprint of the 6-pin electronic package, can be used on the circuit substrate 41 in accordance with the teachings of the present disclosure.

Figure 3:
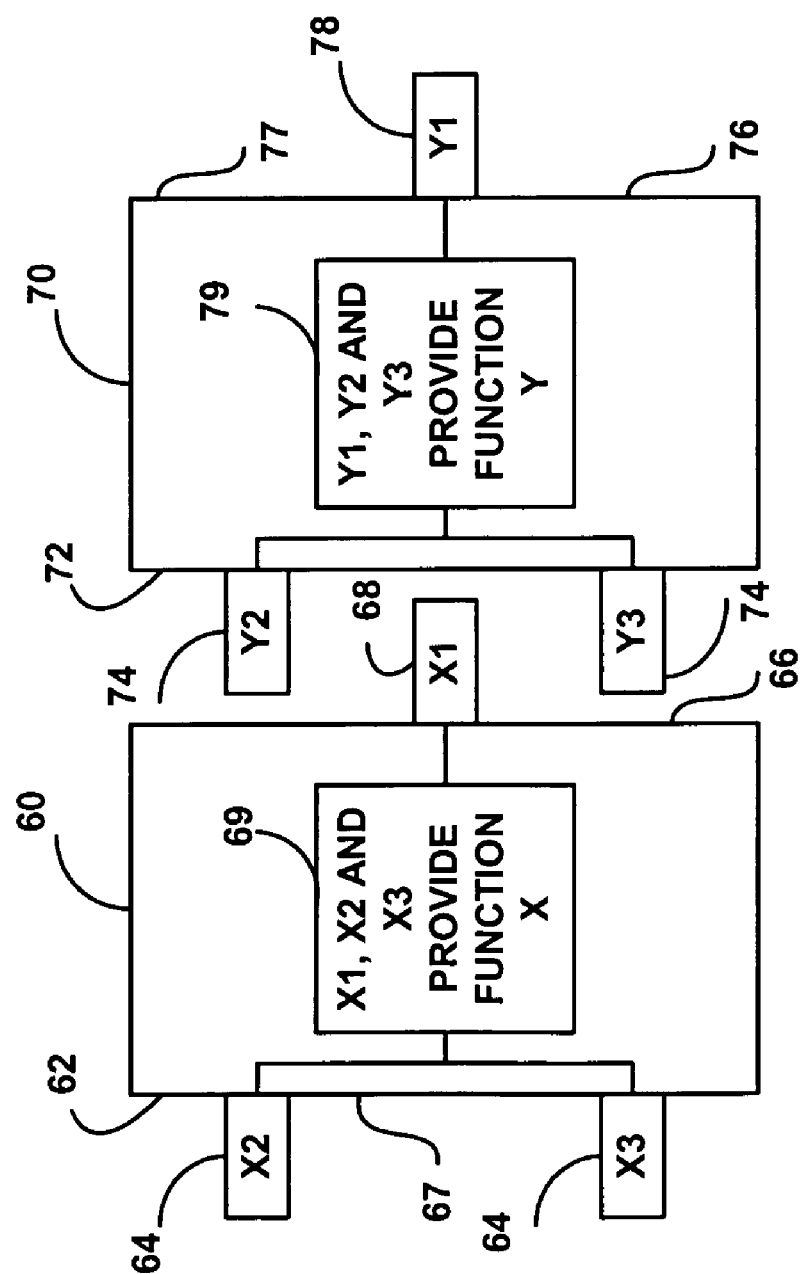
FIG. 3 is a diagram of a first 3-pin electronic package and a second 3-pin electronic package mounted on a circuit substrate in accordance with the teachings of the present disclosure.

Referring to FIG. 3, a first 3-pin electronic package 60 and a second 3-pin electronic package 70 are shown. The first 3-pin electronic package 60 and the second 3-pin electronic package 70 can in combination perform the functions X and Y of the 6-pin electronic package 20 when mounted on the circuit substrate 41 instead of the 6-pin electronic package 20. The first 3-pin electronic package 60 includes a first side 62 having a pair of pins 64 and a second side 66 having a single pin 68. The first 3-pin electronic package 60 also includes an enclosure 67 that houses a first circuit 69. Similarly, the second 3-pin electronic package 70 includes a first side 72 having a pair of pins 74 and a second side 76 having a single pin 78. The 3-pin electronic package 70 also includes an enclosure 77 that houses a second circuit 79. The first circuit 69 performs the function X and the second circuit 79 performs the function Y. Accordingly the first 3-pin electronic package 60 and the second 3-pin electronic package 70 can in combination perform the functions X and Y of the 6-pin electronic package 20 if mounted on the circuit substrate 41 instead of the 6-pin electronic package 20. The first circuit 69 of the 3-pin electronic package 60 is operatively coupled to the pins 68 and 64, which are labeled X1, X2 and X3, respectively, to perform the function X. The second circuit 79 of the 3-pin electronic package 70 is operatively coupled to the pins 78 and 74, which are labeled Y1, Y2 and Y3, respectively, to perform the function Y.

Figure 4:
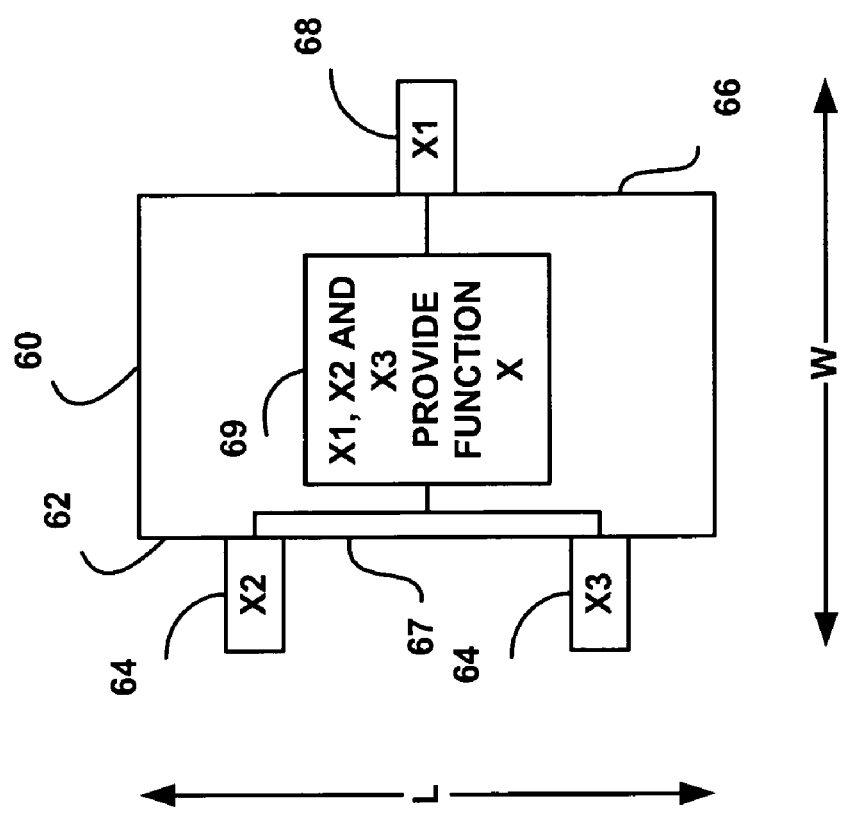
FIG. 4 is a diagram of a 3-pin electronic package.
Figure 5:
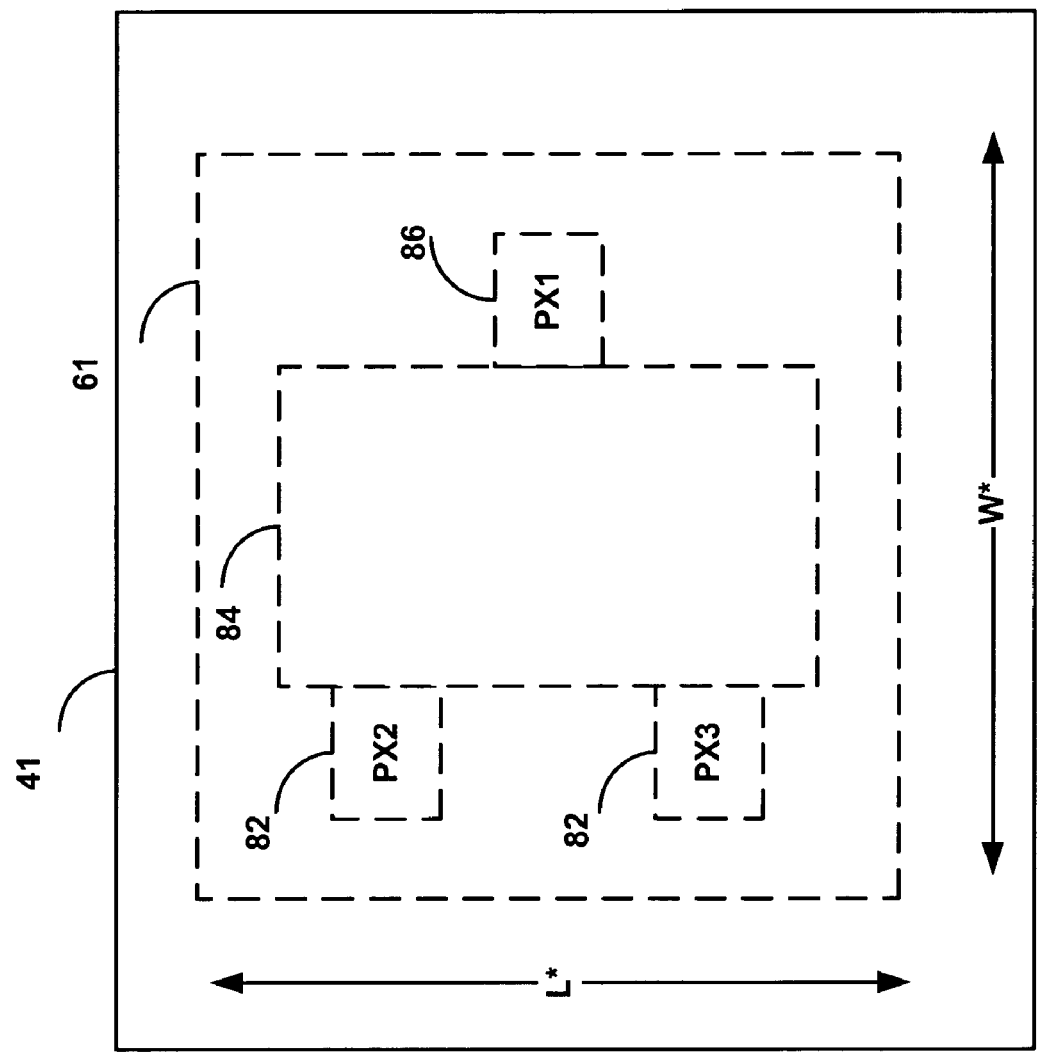
FIG. 5 is a diagram of a footprint on a circuit substrate of the 3-pin electronic package of FIG. 4.

Referring to FIGS. 3 and 4, the first 3-pin electronic package 60 and the second 3-pin package 70 are similar in size to the 6-pin package 20, such that the enclosures 67 and 77 of the 3-pin packages 60 and 70, respectively, are similar in size to the enclosure 34 of the 6-pin electronic package 20. Additionally, each of the pins 68 and 64 of the first 3-pin package 60 and each of the pins 78 and 74 of the second 3-pin electronic package 70 are similarly sized and arranged to correspond to the sizes and arrangements of three corresponding pins on the 6-pin electronic package 20. Accordingly, and with reference to FIG. 1, the width W and length L of the first 3-pin electronic package 60 and the second 3-pin electronic package 70 may be the same as the width W and length L of the 6-pin electronic package 20, respectively. Therefore, with reference to FIG. 5, a footprint 61 of the first 3-pin electronic package 60 or the second 3-pin electronic package 70 may have the same width W* and length L* as the width and length of the footprint 40 of the 6-pin electronic package 20.

Figure 6:
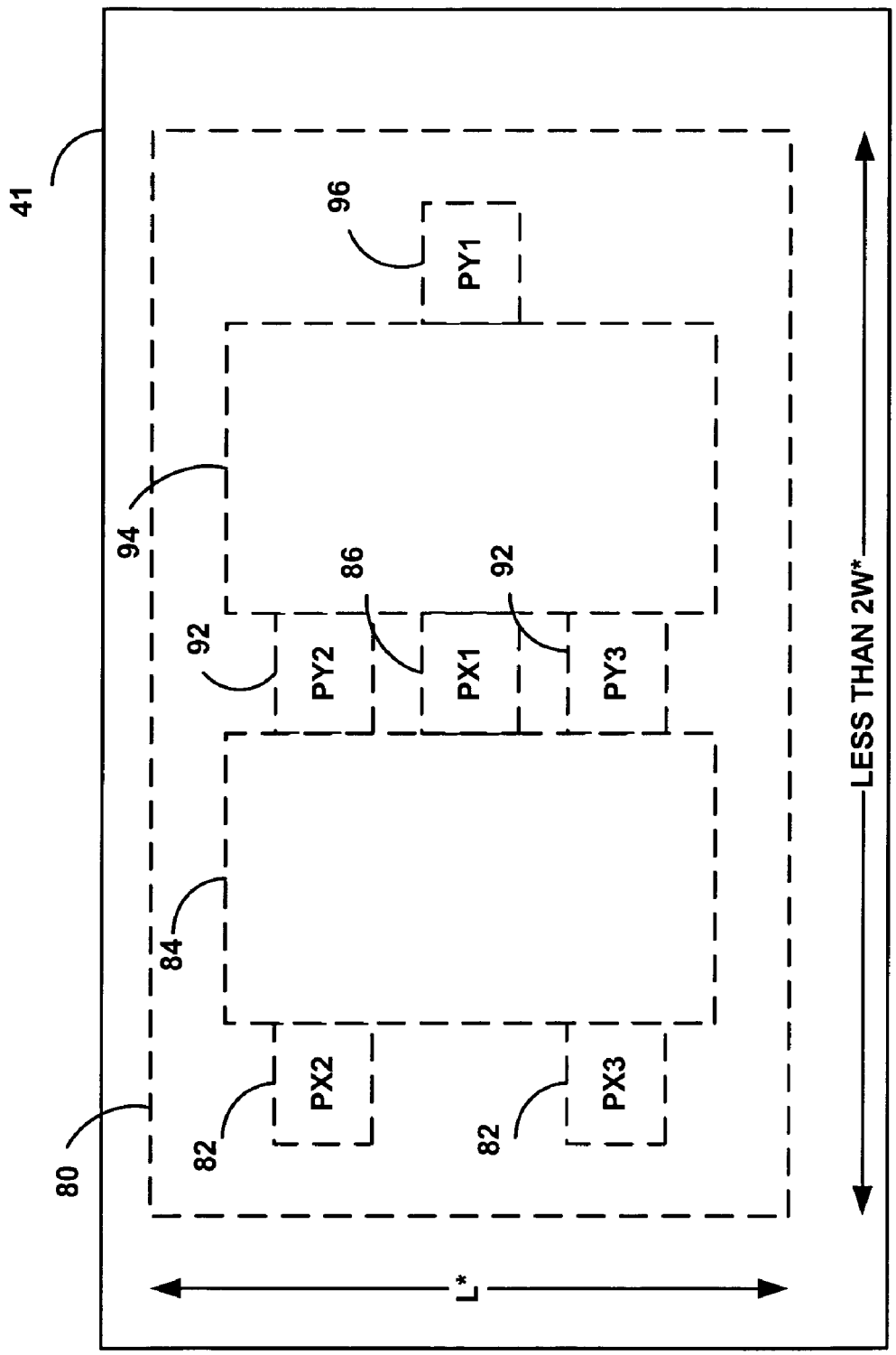
FIG. 6 is a diagram of a footprint of the first 3-pin electronic package and the second 3-pin electronic package of FIG. 3.

As shown in FIG. 3 the first 3-pin electronic package 60 and the second 3-pin electronic package 70 are mounted adjacent to each other on the circuit substrate 41 such that the pin 68 of the first 3-pin electronic package 60 is disposed between the pins 74 of the second 3-pin electronic package 70. Referring to FIG. 6, a total footprint 80 of the first 3-pin electronic package 60 and the second 3-pin electronic package 70 is shown. The pins 64 and 68 of the first 3-pin electronic package 60 are shown to have the footprints 82 and 86, respectively, while the footprint of the enclosure 67 is shown with the reference number 84. The pins 74 and 78 of the second 3-pin electronic package 70 are shown as footprints 92 and 96, respectively, while the footprint of the enclosure 77 is shown with reference number 94.

As described above, the footprint 61 (shown in FIG. 5) of each of the 3-pin electronic packages 60 and 70 may be the same as the footprint 40 of the 6-pin electronic package 20, or have a width of W* and a length of L*. However, as shown in FIG. 6, because the first 3-pin electronic package 60 and the second 3-pin electronic package 70 are mounted on the circuit substrate 41 adjacent to each other such that the pin 68 is disposed between the pins 74, the total footprint 80 of the first 3-pin electronic package 60 and the second 3-pin electronic package 70 is smaller in width than twice the combined individual widths of the footprints 61 of the 3-pin electronic packages 60 and 70. Accordingly, as shown in FIG. 6, the footprint 80 has a width that is less than 2W* and a length of L*.

Figure 7:
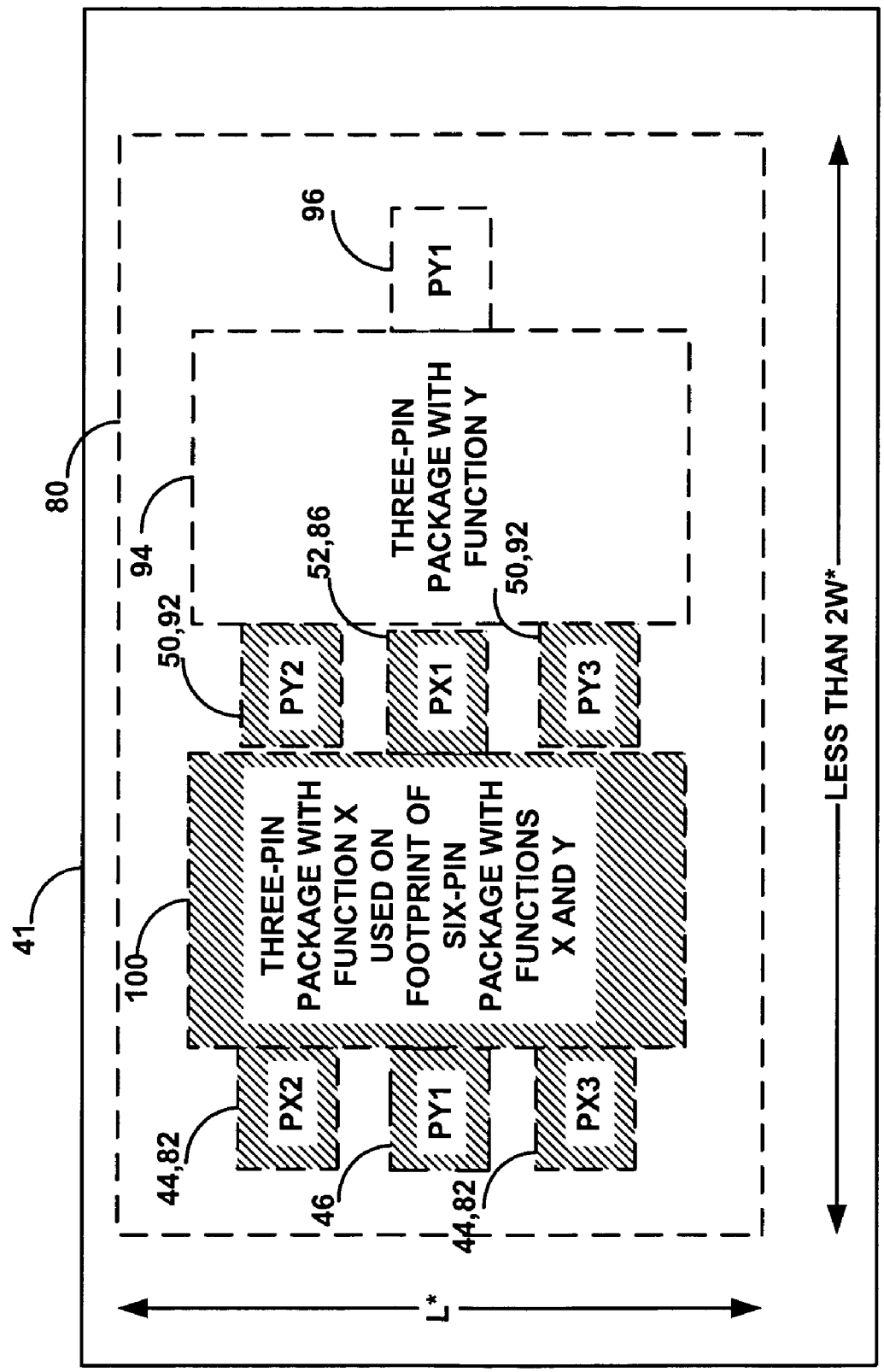
FIG. 7 is a diagram of the first 3-pin electronic package and the second 3-pin electronic package of FIG. 3 showing the sharing of the footprint of the 6-pin electronic package of FIGS. 1 and 2.

Referring to FIG. 7, the first 3-pin electronic package 60 can be mounted on the circuit substrate 41 at the same location as the mounting of the 6-pin electronic package 20. Accordingly, the first 3-pin electronic package 60 occupies the same footprint on the circuit substrate 41 as the footprint 40 of the 6-pin electronic package 20. This sharing of footprint between the 6-pin electronic package 20 and the first 3-pin electronic package 60 is shown in FIG. 7 by the hatched area 100. Enclosure 34 of the 6-pin electronic package 20 and the enclosure 67 of the 3-pin electronic package 60 share the same footprints 54 and 84 as shown in FIG. 7. The first outer pins 24 of the 6-pin electronic package 20 share the same footprint as the pins 64 of the first 3-pin electronic package 60 as shown by the footprints 44 and 82. The second middle pin 32 of the 6-pin electronic package 20 and the pin 68 of the first 3-pin electronic package 60 share the same footprint as shown in FIG. 7 by reference numbers 52 and 86. Accordingly, the first 3-pin electronic package 60 occupies the same footprint as the 6-pin electronic package 20 on the circuit substrate 41 such that the footprints of the first 3-pin electronic package 60 share the same footprints as three corresponding pins of the 6-pin electronic package 20. Except for the footprint 46 of the first middle pin 26 of the 6-pin electronic package 20, the remaining footprints of the 6-pin electronic package 20 that are not occupied by the first 3-pin electronic package 60 are shared by the second 3-pin electronic package 70.

The pins 74 of the second 3-pin electronic package 70 occupy the same footprint as the footprint of the second outer pins 30 of the 6-pin electronic package 20 as shown in FIG. 7 by reference numerals 50 and 92. Therefore, by mounting the first 3-pin electronic package 60 and the second 3-pin electronic package 70 on the circuit substrate adjacent to each other as shown in FIG. 3, the footprint of the 6-pin electronic package 20 is utilized by both the first 3-pin electronic package 60 and the 3-pin electronic package 70. Therefore, the width of the total footprint 80 of the first 3-pin electronic package 60 and the second 3-pin electronic package 70 is less than twice the total of the individual footprint widths of the first 3-pin electronic package 60 and the second 3-pin electronic package 70.

Figure 8:
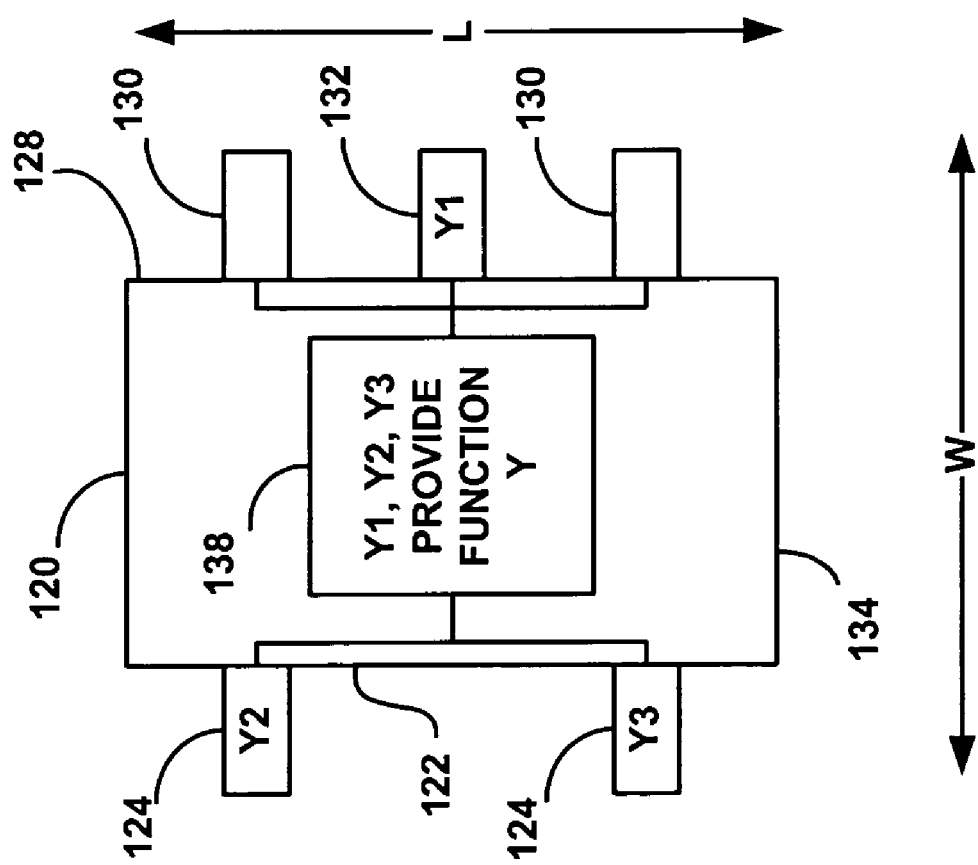
FIG. 8 is a diagram of a 5-pin electronic package.

Referring to FIG. 8, a 5-pin electronic package 120 is shown. The 5-pin electronic package 120 includes a first side 122 having a pair of outer pins 124, and a second side 128 having a pair of outer pins 130 and a middle pin 132. The 5-pin electronic package 120 includes an enclosure 134 that is similar in size to the enclosures of the above-described 3-pin electronic packages 60 and 70, and the 6-pin electronic package 20. The 5-pin electronic package includes at least one circuit 138 that performs any one of the functions X and Y. In the following and as shown in FIG. 8, the 5-pin electronic package 120 is described as performing the function Y.

Figure 9:
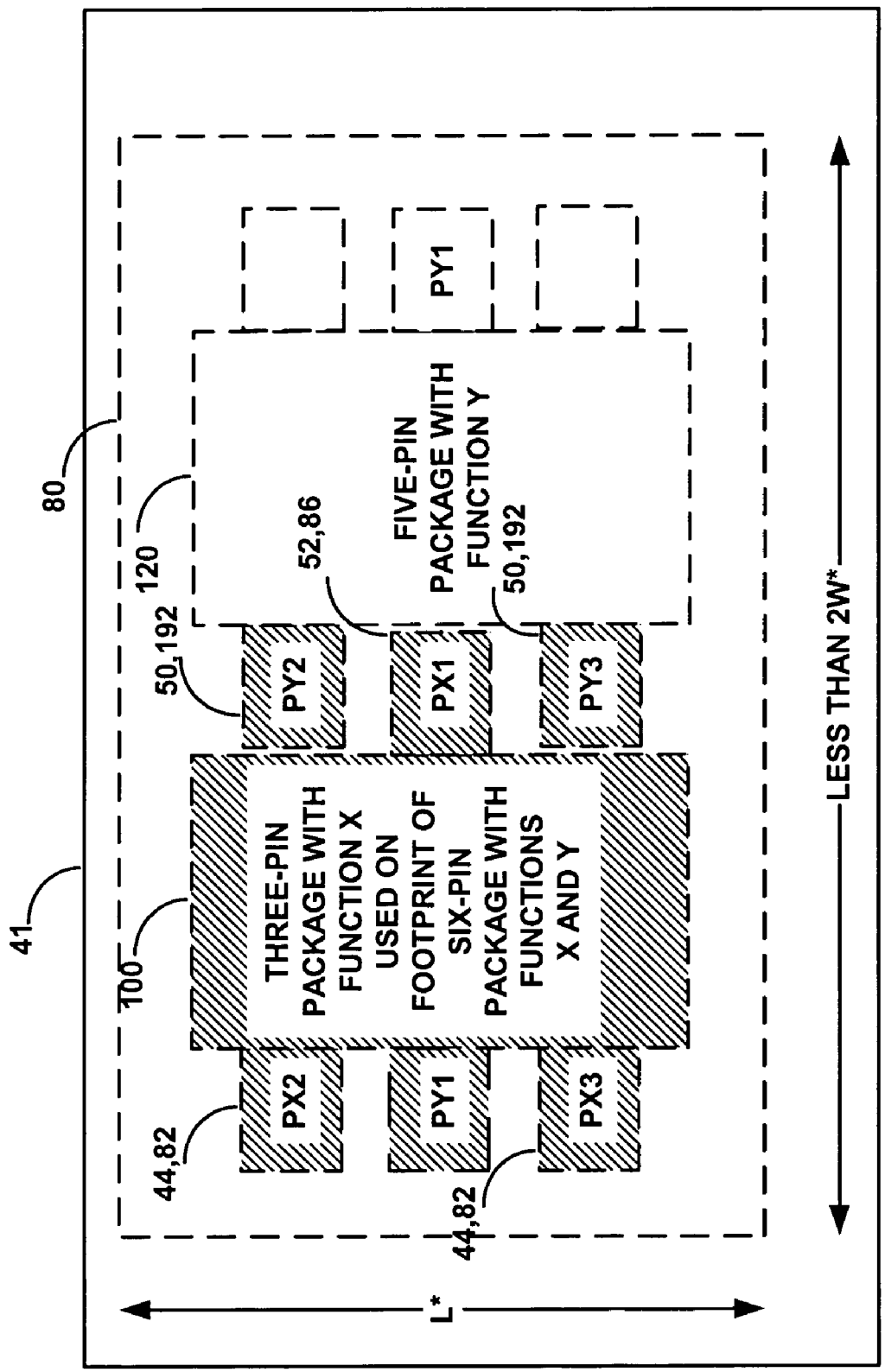
FIG. 9 is a diagram of a 3-pin electronic package and the 5-pin electronic package of FIG. 8 showing the sharing of the footprint of the 6-pin electronic package of FIGS. 1 and 2, in accordance with the teachings of the present disclosure.

Referring to FIGS. 8 and 9, an example of using a 3-pin electronic package and a 5-pin electronic package on a circuit substrate in accordance with the teachings of the present disclosure instead of the 6-pin electronic package is shown. In FIG. 9, instead of the second 3-pin electronic package 70, the 5-pin electronic package 120 is used. Accordingly, identical components of FIG. 7 and FIG. 9 are assigned the same reference numbers in FIG. 9, and the first 3-pin electronic package 60 is referred to as the 3-pin electronic package 60. Similar to FIG. 7, the 3-pin electronic package 60 can be mounted on the circuit substrate 41 at the same location as the mounting of the 6-pin electronic package 20. Accordingly, the 3-pin electronic package 60 occupies the same footprint on the circuit substrate 41 as the footprint 40 of the 6-pin electronic package 20. This sharing of footprint between the 6-pin electronic package 20 and the 3-pin electronic package 60 is shown in FIG. 9 by the hatched area 100. Enclosure 34 of the 6-pin electronic package 20 and the enclosure 67 of the 3-pin electronic package 60 share the same footprints 54 and 84 as shown in FIG. 9. The first outer pins 24 of the 6-pin electronic package 20 share the same footprint as the pins 64 of the 3-pin electronic package 60 as shown by the footprints 44 and 82. The second middle pin 32 of the 6-pin electronic package 20 and the pin 68 of the 3-pin electronic package 60 share the same footprint as shown in FIG. 9 by reference numbers 52 and 86. Accordingly, the 3-pin electronic package 60 occupies the same footprint as the 6-pin electronic package 20 on the circuit substrate 41 such that the footprint of the 3-pin electronic package 60 share the same footprints as three corresponding pins of the 6-pin electronic package 20. Except for the footprint 46 of the first middle pin 26 of the 6-pin electronic package 20, the remaining footprints of the 6-pin electronic package 20 that are not occupied by the first 3-pin electronic package 60 are shared by the 5-pin electronic package 120.

The pins 124 of the 5-pin electronic package 120 that have footprints 192 occupy the same footprint as the footprint 50 of the second outer pins 30 of the 6-pin electronic package 20 as shown in FIG. 9 by reference numerals 50 and 192. Therefore, by mounting the 3-pin electronic package 60 and the 5-pin electronic package 120 on the circuit substrate adjacent to each other, the footprint of the 6-pin electronic package 20 is utilized by both the 3-pin electronic package 60 and the 5-pin electronic package 120. Therefore, the width of the total footprint 80 of the 3-pin electronic package 60 and the 5-pin electronic package 120 is less than twice the total of the individual footprint widths of the 3-pin electronic package 60 and the 5-pin electronic package 120.

The above-described 6-pin electronic package 20, the 3-pin electronic packages 60 and 70, and the 5-pin electronic package 120 may be standard 6-pin, 3-pin and 5-pin electronic packages, respectively, that are commonly used in electronics and are well known in the art. For example, the 6-pin electronic package 20 may be a standard SOT-23-6 (Small-Outline Transistor) electronic package that is used in typical electronic devices. However, if the present disclosure is applied to the standard SOT-23-6 electronic package, the functional arrangement of the pins should be identical to the arrangement of the pins for the 6-pin electronic package 20 described herein and shown in FIG. 1. If the 6-pin electronic package 20 is a SOT-23-6 package, then the 3-pin electronic packages 60 and 70, and the 5-pin electronic package 120 should also be standard SOT-23-3 and SOT-23-5 electronic packages, respectively with the functional pin arrangements as described herein and shown in FIGS. 3 and 8.

In the present disclosure, the 6-pin electronic package 20 can be replaced or substituted with the 3-pin electronic packages 60 and 70, or the 3-pin electronic package 60 and the 5-pin electronic package 120, without using a large portion of the circuit substrate 41 due to the above-described pin and footprint sharing. For example, a manufacturer of an electronic device may use either the 6-pin electronic package 20, the 3-pin electronic packages 60 and 70, or the 3-pin electronic package 60 and the 5-pin electronic package 120 in constructing the electronic device. Accordingly, the manufacturer can stock a supply of the 6-pin electronic package 20, the 3-pin electronic packages 60 and 70, and the 5-pin electronic package 120. However, during manufacturing of the electronic device, the manufacturer may deplete the stock of the 6-pin electronic package 20. With the disclosed 6-pin electronic package 20, and in particular, the pin arrangement of the 6-pin electronic package 20, the manufacturer can instead use the 3-pin electronic packages 60 and 70, or the 3-pin electronic package 60 and the 5-pin electronic package 120.

The present 6-pin electronic package 20, and in particular, the disclosed pin arrangement of the 6-pin electronic package 20, provides the use of the 3-pin electronic packages 60 and 70, or the 3-pin electronic package 60 and the 5-pin electronic package 120 on the footprint 40 that the 6-pin electronic package 20 occupies when mounted on the circuit substrate 41. Additionally, due to the pin arrangement of the 6-pin electronic package 20, the 3-pin electronic package 70 or the 5-pin electronic package 120 can be mounted adjacent the first 3-pin electronic package 60 such that the 3-pin electronic package 70 or the 5-pin electronic package 120 also share portions of the footprint 40 of the 6-pin electronic package 20. Accordingly, in circumstances where the 3-pin electronic packages 60 and 70, or the 3-pin electronic package 60 and the 5-pin electronic package 120 are or may have to be mounted on a circuit substrate 41 instead of the 6-pin electronic package 20, space on the circuit substrate 41 is preserved in accordance with the present disclosure.

Although 3-pin and 5-pin electronic packages are described herein as being interchangeably used instead of the 6-pin electronic package 20, one of ordinary skill in the art will readily appreciate that any pairs of electronic packages that are sized, collectively have at least six pins, and are configured and include pin arrangements that in combination can share the pins of the 6-pin electronic package as described herein can be used on the circuit substrate in accordance with the teachings of the present disclosure.

Furthermore, the invention is not limited to particular details of the apparatus and method depicted and the modifications and applications may be contemplated. Certain other changes may be made in the above-described method and apparatus without departing from the true spirit of the scope of the invention herein involved. It is intended, therefore, that the subject matter in the above depiction should be interpreted as illustrative and not in a limiting sense.

What is claimed is:

1. A 6-pin only electronic package comprising:
a first side of the 6-pin only package including a pair of first outer pins and a first middle pin;
a second side of the 6-pin only package including a pair of second outer pins and a second middle pin;
wherein the pair of first outer pins and the second middle pin are operatively coupled to a first circuit to provide a first function; and
wherein the pair of second outer pins and the first middle pin are operatively coupled to a second circuit to provide a second function.

2. The 6-pin only electronic package of claim 1, wherein the first circuit is a single component circuit.

3. The 6-pin only electronic package of claim 1, wherein the second circuit is a single component circuit.

4. The 6-only pin electronic package of claim 1, wherein the first function and the second function are identical functions.

5. The 6-pin only electronic package of claim 1, wherein the first function is extractable from the second function.

6. The 6-pin only electronic package of claim 1, being configured as a SOT-23-6electronic package.

7. An electronic device comprising:
at least one circuit substrate; and
at least one of:
a 6-pin only electronic package mounted on the circuit substrate and including a first circuit to perform a first function and a second circuit to perform a second function; and
a combination of a first electronic package mounted on the circuit substrate and including the first circuit to perform the first function and a second electronic package mountable on the circuit substrate and including the second circuit to perform the second function;
wherein the 6-pin only electronic package when present comprises:
a first side including a pair of first outer pins and a first middle pin;
a second side including a pair of second outer pins and a second middle pin;
wherein the pair of first outer pins and the second middle pin are operatively coupled to provide a first function; and
wherein the pair of second outer pins and the first middle pin are operatively coupled to provide a second function;
wherein the first electronic package when present includes a plurality of pins sharing the footprint of at least three pins of the 6-pin only electronic package; and
wherein the second electronic package when present includes a plurality of pins sharing the footprint of at least one pin of the 6-pin only electronic package.

8. The device of claim 7, wherein the first electronic package and the second electronic package comprise a pair of 3-pin electronic packages.

9. The device of claim 7, wherein the first and second electronic packages comprise a 3-pin electronic package and a 5-pin electronic package.

10. The device of claim 7, wherein the first circuit is a single component circuit.

11. The device of claim 7, wherein the second circuit is a single component circuit.

12. The device of claim 7, wherein the first function and the second function are identical functions.

13. The device of claim 7, wherein the first function is extractable from the second function.

14. The device of claim 7, wherein the 6-pin only electronic package and the first and second electronic packages are based upon standard Small-Outline Transistor electronic package configurations.

* * * * *